United States Patent
Voogel

[19]

[11] Patent Number: 5,986,958
[45] Date of Patent: Nov. 16, 1999

[54] DRAM CONFIGURATION IN PLDS

[75] Inventor: Martin L. Voogel, Santa Clara, Calif.

[73] Assignee: Xilinx, Inc., San Jose, Calif.

[21] Appl. No.: 09/016,546

[22] Filed: Jan. 30, 1998

[51] Int. Cl.[6] .................................................. G11C 7/00
[52] U.S. Cl. ...................... 365/222; 365/154; 365/156
[58] Field of Search .................... 365/154, 156, 365/222, 149

[56] References Cited

U.S. PATENT DOCUMENTS

| | | | |
|---|---|---|---|
| 4,750,155 | 6/1988 | Hsieh | 365/203 |
| 4,821,233 | 4/1989 | Hsieh | 365/203 |
| 5,771,189 | 6/1998 | Jun et al. | 365/149 |
| 5,835,403 | 11/1998 | Forbes | 365/149 |
| 5,838,606 | 11/1998 | Blankenship et al. | 365/156 |

*Primary Examiner*—Son T. Dinh
*Attorney, Agent, or Firm*—Arthur J. Behiel; Jeanette S. Harms

[57] ABSTRACT

Described are dynamic memory cells for use in FPGAs. Each memory cell includes a dynamic memory element that occupies less chip area than conventional static memory elements and that can be implemented using standard CMOS processes. In one embodiment, a conventional access transistor is connected to a pass transistor via a CMOS inverter. The CMOS inverter includes a pair of complementary MOS transistors sharing a common gate connection, and therefore exhibiting a combined gate capacitance. This gate capacitance at the input of the inverter supplements or replaces the capacitor normally required in conventional dynamic memory cells. Another embodiment uses the parasitic gate capacitance of a pass transistor for dynamic data storage. This embodiment requires that the voltage levels on the source and drain of the pass transistor be controlled during write and refresh operations to ensure that the gate capacitance of pass transistor stores an appropriate level of charge.

7 Claims, 2 Drawing Sheets

DRAM CONFIGURATION IN PLDS

BACKGROUND OF THE INVENTION

1. Field Of The Invention

This invention relates generally to programmable logic devices, and in particular to memory cells used to define the configuration of programmable logic devices.

2. Description of the Related Art

Programmable logic devices (PLDs) are a well-known type of digital integrated circuit that may be programmed by a user (e.g., a circuit designer) to perform specified logic functions. PLDs are becoming ever more popular, largely because they are less expensive and require less time to implement than semi-custom and custom integrated circuits.

One type of PLD, the field-programmable gate array (FPGA), typically includes an array of configurable logic blocks, or CLBs, that are programmably interconnected to each other and to programmable input/output blocks (IOBs). This collection of configurable elements may be customized by loading configuration data into internal configuration memory cells that, by determining the state of various programming points, define how the CLBs, interconnections, and IOBs are configured. The configuration data may be read from memory (e.g., an external PROM) or written into the FPGA from an external device. The collective states of the individual memory cells then determine the function of the FPGA.

Typical FPGAs, for example a device of the Xilinx XC4000™ family of FPGAs commercially available from Xilinx, Inc., include one configuration memory cell to control each programming point. FIG. 1 illustrates an exemplary memory cell 100, which includes a conventional static memory element 101 (cross-coupled inverters) and an access transistor 105. Each of the cross-coupled inverters is typically implemented using a pair of MOS transistors, so that the total number of transistors in memory cell 100 (including access transistor 105) is five. For a more detailed discussion of the function and configuration of suitable five-transistor memory cells, see U.S. Pat. No. 4,821,233, which issued on Apr. 11, 1989, and U.S. Pat. No. 4,750,155, which issued on Jun. 7, 1988, each of which is incorporated herein by reference.

Memory cell 100 forms the basic control unit for all logic functions on the FPGA. The program state of memory element 101 determines whether a conventional pass transistor 107 conducts, and consequently whether interconnect segments 107S and 107D (connected to the respective source and drain of pass transistor 107) are electrically connected.

One way to optimize a memory cell is to eliminate the need for one or more transistors, thereby freeing up valuable chip area and allowing greater circuit density. For example, dynamic random-access memory (DRAM) cell 200, shown in FIG. 2, includes fewer transistors than memory cell 100. DRAM cell 200 is conventionally connected to a memory control circuit 202 via a memory-access line WORD and a memory-refresh line BIT to an access transistor 208. A capacitor 206 is alternatively used to store a voltage representative of a logic one (e.g., 3.3 volts) or a voltage representative of a logic zero (e.g., 0 volts); an access transistor 208 is used to write and read those voltages to and from capacitor 206.

Memory control circuit 202 conventionally includes refresh circuitry. As is well known to those of skill in DRAM technology, this refresh circuitry is needed to periodically refresh the voltage level stored by capacitor 206 because capacitor 206 loses charge over time due to leakage current. Refreshing data includes reading the stored voltage level, determining whether that level represents a logic one or a logic zero, and then restoring the voltage level to a pre-leakage level. The capacitance of capacitor 206 is selected such that some minimum level of charge is maintained between the periodic refresh cycles.

Applying conventional DRAM technology to FPGAs is problematic. Capacitor 206, if implemented laterally, occupies a substantial amount of chip area. DRAM manufacturers have successfully addressed this problem through the use of trench capacitors; unfortunately, the manufacture of trench capacitors requires complex processing techniques that are not normally required for FPGA manufacturing, which typically employs a standard CMOS process. Either alternative —increased chip area or process complexity— increases the cost of producing FPGAs.

SUMMARY OF THE INVENTION

The present invention is directed to a memory cell that includes a dynamic memory element that occupies less chip area than conventional static memory elements and that can be implemented using standard CMOS processes. In one embodiment of the invention, a conventional access transistor is connected to a programming point (e.g., a pass transistor) via a CMOS inverter. The CMOS inverter includes a pair of complementary MOS transistors sharing a common gate connection, and therefore exhibiting a combined gate capacitance. This gate capacitance at the input of the inverter supplements or replaces the capacitor normally required in conventional dynamic memory cells. Conventional memory control circuitry directs read, write, and refresh operations.

As compared to memory cell 100 of FIG. 1, the inventive memory cell includes one fewer inverters, and therefore two fewer transistors. This reduction in the number of necessary transistors saves valuable chip area. Moreover, memory cells in accordance with the invention can be formed using standard CMOS processes because conventional MOS transistors supply the requisite capacitance.

A memory cell in accordance with another embodiment of the invention uses the parasitic gate capacitance of a pass transistor for dynamic data storage. This embodiment requires that the voltage levels on the source and drain of the pass transistor be controlled during write and refresh operations to ensure that the gate capacitance of pass transistor stores an appropriate level of charge.

BRIEF DESCRIPTION OF THE FIGURES

Features, aspects, in the advantages of the present invention will become better understood with regard to the following description and accompanying figures, where.

DETAILED DESCRIPTION OF THE FIGURES

Figure 3:
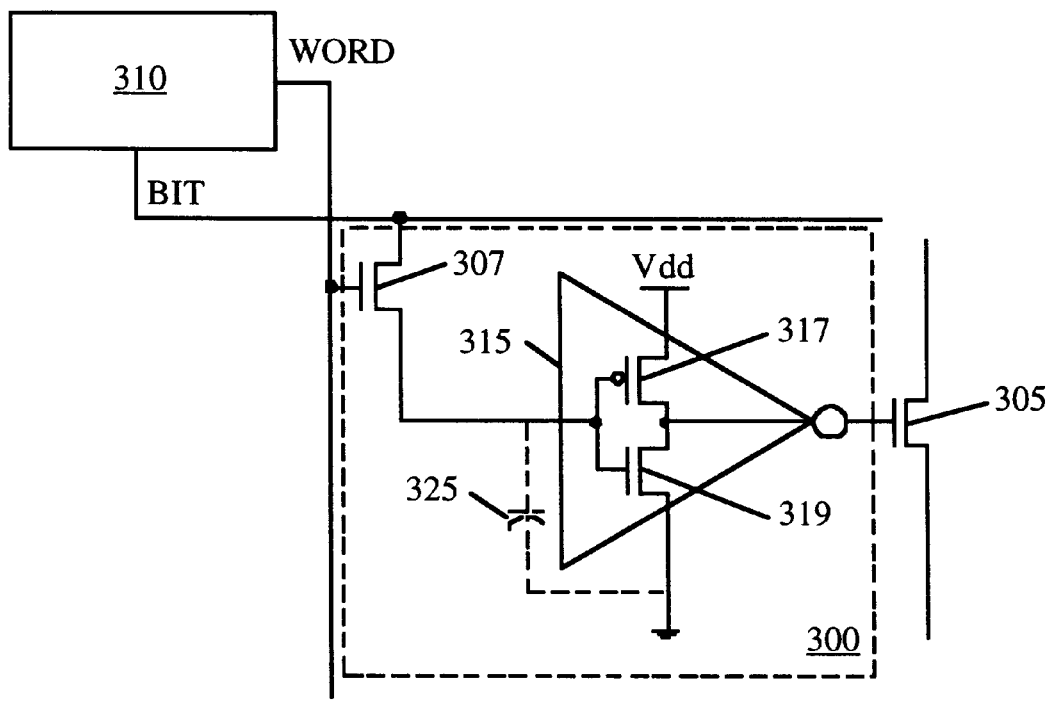
FIG. 3 depicts a dynamic memory cell 300 configured in accordance with the present invention.

FIG. 3 depicts a dynamic memory cell 300 configured in accordance with the present invention. Memory cell 300 is shown connected to the gate of a pass transistor 305; however, memory cell 300 may also be used to define the states of other types of programming points.

Figure 1:
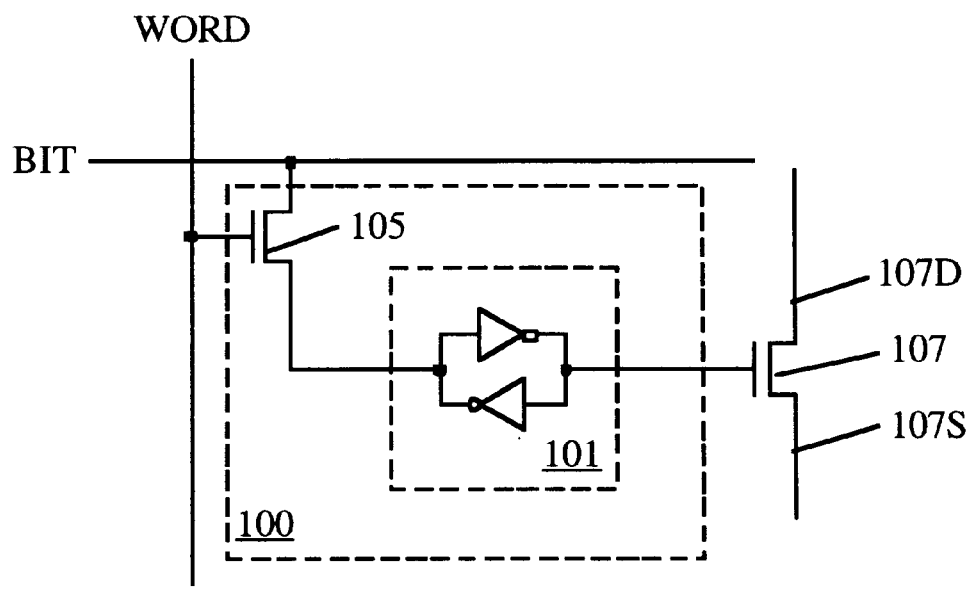
FIG. 1 depicts an exemplary memory cell 100, which includes a conventional static memory element 101 and an access transistor 105.
Figure 2:
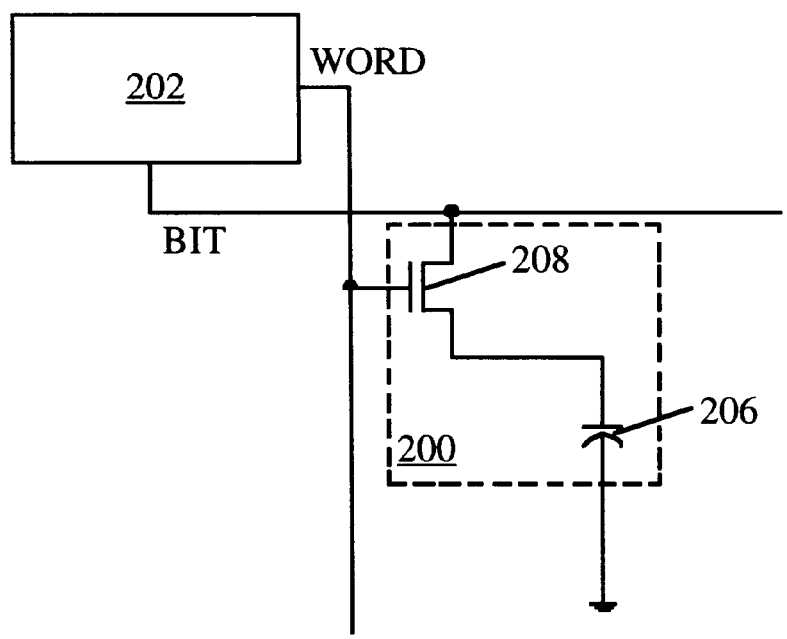
FIG. 2 depicts a conventional dynamic random-access memory (DRAM) cell 200 connected to a conventional memory control circuit 202 via a memory-access line WORD and a memory-refresh line BIT to an access transistor 208.

As with the conventional memory cell 100 of FIG. 1, memory cell 300 includes an access transistor 307. And, like the conventional DRAM cell of FIG. 2, memory cell 300 includes a memory control circuit 310. Unlike conventional dynamic memory circuits, however, memory cell 300 includes one inverter 315, which conventionally includes a PMOS transistor 317 and an NMOS transistor 319. The input terminal of inverter 315 is connected to one current-handling terminal of access transistor 307; the output terminal of inverter 315 is connected to the control terminal (gate) of pass transistor 305.

The combined gate capacitances of transistors 317 and 319 represent the input capacitance of inverter 315. This collective capacitance is illustrated in FIG. 3 as a "parasitic" capacitance 325 between the input terminal of inverter 315 and ground potential (e.g., zero volts). Parasitic capacitance 325 supplements or replaces the capacitor normally required in conventional dynamic memory cells. As with conventional DRAMS, the value of parasitic capacitance 325 and the refresh rate of memory cell 300 must be selected to ensure that some minimum level of charge is maintained on capacitance 325 between refresh cycles. For example, the refresh rate might be established to ensure that the voltage level on capacitance 325 remains within a few tenths of a volt below Vdd when storing a logic one. Voltages below Vdd minus the threshold voltage of transistor 317 (typically about 0.6 volts) can be tolerated, but will result in undesirable leakage current through transistors 317 and 319.

As compared to memory cell 100 of FIG. 1, memory cell 300 includes one fewer inverter, and therefore two fewer transistors. This reduction in the number of necessary transistors saves valuable chip area. Moreover, memory cell 300 in accordance with the invention can be formed using standard CMOS processes instead of the more complex trench-capacitor processes normally used in dynamic memory.

Memory cell 300 is an inverting cell, in the sense that the information read out must be inverted before it is placed back into the cell upon refresh. This is true of some conventional DRAM cells; consequently, the circuitry required to account for this inversion is well understood by those skilled in the art.

Figure 4:
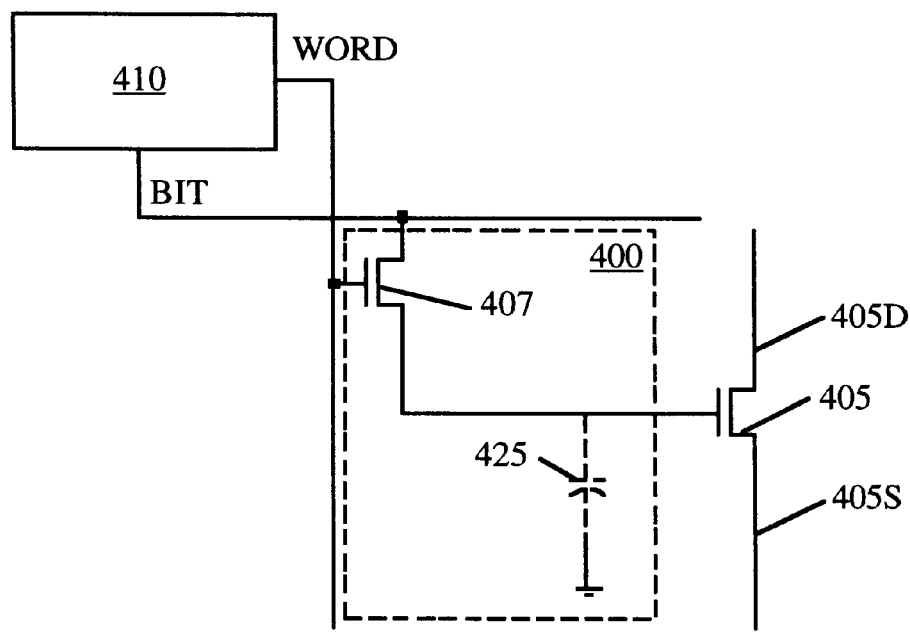
FIG. 4 depicts a dynamic memory cell 400 configured in accordance with another embodiment of the present invention.

FIG. 4 depicts a dynamic memory cell 400 configured in accordance with another embodiment of the present invention. Memory cell 400 is shown connected to the gate of a pass transistor 405 to control the state (on/off) of that transistor.

Memory cell 400 functions in much the same way as memory cell 300 of FIG. 3. However, instead of relying on the input of an inverter for a capacitive storage element, memory cell 400 uses the parasitic gate capacitance 425 of pass transistor 405 for dynamic data storage.

The value of parasitic capacitance 425 and associated refresh rate should be selected to ensure that some minimum level of charge is maintained on capacitance 425 between refresh cycles. The level of charge representing a logic one should be within a few tenths of a volt of Vdd; otherwise, transistor 405 might unduly limit the current from drain 405D to source 405S, and consequently reduce the speed performance of the FPGA. Parasitic capacitance 425 can be supplemented with additional capacitance as necessary.

Memory cell 400 includes two fewer inverters, and, therefore, four fewer transistors, than memory cell 100. This, of course, leads to substantial savings in valuable chip area. And, like memory cell 300, memory cell 400 can be formed using standard CMOS processes.

The gate of pass transistor 405 is capacitively coupled to the source 405S and the drain 405D. Consequently, the voltage levels on source 405S and drain 405D must be controlled during write and refresh operations to ensure storage of the appropriate level of charge. Consider, for example, the case where a refresh operation, in an attempt to store a positive charge on parasitic capacitance 425, applies 3.3 volts to the gate of pass transistor 405. If at that time source 405S and drain 405D are also at 3.3 volts, then no charge would be stored on parasitic capacitance 425. Thus, the voltage levels on the source and drain must be controlled to store predictable levels of charge on parasitic capacitance 425 during write and refresh operations. Table 1 below summarizes the voltages applied for writing logic ones and zeros in the embodiment of FIG. 4.

| TERMINALS | LOGIC 1 (e.g., 3.3 V) | LOGIC 0 (e.g., 0 V) |
| --- | --- | --- |
| Source/Drain | 0 V | 3.3 V |
| Gate | 3.3 V | 0 V |

TABLE 1: VOLTAGE LEVELS FOR WRITING TO CAPACITANCE 425

Source 405S and drain 405D should be held at ground potential when writing (or refreshing) a logic one. The voltage level on parasitic capacitance 425 can then go above the positive supply voltage (Vdd) if the voltage levels on source 405S and/or drain 405D go to Vdd.

Source 405S and drain 405D should be held at Vdd when writing (or refreshing) a logic zero. The voltage level on parasitic capacitance 425 can then go below zero should the voltage levels on source 405S and/or drain 405D go to ground potential. If the p-well of transistor 407 is grounded, bringing the source of transistor 407 below ground potential will forward bias the junction between the source and the p-well, clamping the voltage level on parasitic capacitance 425 to about −0.6 volts, thereby reducing the level of stored charge on capacitance 425. For this reason, access transistor 407 may require a separate p-well tied to its source.

While the present invention has been described in connection with specific embodiments, variations of these embodiments will be obvious to those of ordinary skill in the art. For example, some components are shown directly connected to one another while others are shown connected via intermediate components. In each instance, the method of interconnection establishes some desired electrical communication between two or more circuit nodes. Such communication may often be accomplished using a number of circuit configurations, as will be understood by those of skill in the art. Therefore, the spirit and scope of the appended claims should not be limited to the foregoing description.

I claim:

1. A dynamic memory cell for a programmable logic device, the memory cell comprising:
    an access transistor having:
        a control terminal connected to a memory-access line;
        a first current-handling terminal connected to a memory-refresh line; and
        a second current-handling terminal;

an inverter having:
  an input terminal; and
  an output terminal,
    the input terminal being connected to the second current-handling terminal of the access transistor, wherein the input terminal of the inverter exhibits a parasitic capacitance;
a pass transistor having:
  a control terminal connected to the output terminal of the inverter;
  a first current-handling terminal connected to a first interconnect segment; and
  a second current-handling terminal connected to a second interconnect segment,
    wherein the first and second interconnect segments are selectively connected by presenting a specified voltage level on the control terminal of the pass transistor; and
a memory refresh circuit having:
  an output terminal connected to the control terminal of the access transistor,
    the memory refresh circuit configured to periodically bias the access transistor on to refresh the voltage level on the input terminal of the inverter,
wherein the capacitance of the input terminal of the inverter is selected to retain at least a minimum level of charge between the periodic biasing of the access transistor.

2. The memory cell of claim 1, wherein the inverter further includes:
  a first MOS transistor having a gate terminal connected to the second current-handling terminal of the access transistor; and
  a second MOS transistor having a gate terminal connected to the second current-handling terminal of the access transistor,
  wherein the capacitance associated with the input terminal of the inverter is the collective capacitance of the gates of the first and second MOS transistors.

3. The memory cell of claim 2, wherein the first MOS transistor is a PMOS transistor and the second MOS transistor is an NMOS transistor.

4. The memory cell of claim 3, wherein the inverter is a CMOS inverter.

5. A dynamic memory for a programmable logic device, the memory comprising:
  a plurality of memory cells, each memory cell including:
    an access transistor having:
      a control terminal connected to a memory-access line;
      a first current-handling terminal connected to a memory-refresh line; and
      a second current-handling terminal;
    a pass transistor having:
      a control terminal connected to the second current-handling terminal of the access transistor;
      a first current-handling terminal connected to a first interconnect segment and electrically insulated from the pass-transistor control terminal; and
      a second current-handling terminal connected to a second interconnect segment and electrically insulated from the pass-transistor control terminal,
      wherein the first and second interconnect segments are selectively connected by presenting a specified voltage level on the control terminal of the pass transistor; and
    a memory refresh circuit having an output terminal connected to the control terminal of the access transistor, the memory refresh circuit configured to periodically bias the access transistor on to refresh the voltage level on the control terminal of the pass transistor.

6. A method of writing binary data to a memory cell in a programmable logic device, wherein the memory cell comprises an access transistor having a control terminal connected to a word line, a first current-handling terminal connected to a bit line, and a second current-handling terminal connected to the gate of an MOS pass transistor, the method comprising:
  writing data of a first logic level or a second logic level to the gate of the pass transistor;
  when writing data of the first logic level,
    holding the source and the drain of the pass transistor to a first voltage level; and
    holding the gate of the pass transistor to a second voltage level different from the first voltage level; and
  when writing data of the second logic level,
    holding the source and the drain of the pass transistor to the second voltage level; and
    holding the gate of the pass transistor to the first voltage level.

7. The method of claim 6, wherein the pass transistor exhibits a gate capacitance, the method further comprising:
  determining a refresh rate of the gate capacitance based on a value of the gate capacitance and a charge-leakage rate of the gate capacitance; and refreshing the voltage level on the gate capacitance at the refresh rate during operation of the programmable logic device.

* * * * *